United States Patent [19]
Tsui et al.

[11] Patent Number: 5,394,033
[45] Date of Patent: Feb. 28, 1995

[54] STRUCTURE AND METHOD FOR IMPLEMENTING HIERARCHICAL ROUTING POOLS IN A PROGRAMMABLE LOGIC CIRCUIT

[75] Inventors: Cyrus Y. Tsui, Los Altos; Ju Shen, Saratoga; Chanchi J. Cheng, San Jose; Ming C. Hsu, San Ramon, all of Calif.

[73] Assignee: Lattice Semiconductor Corporation, Hillsboro, Oreg.

[21] Appl. No.: 115,723

[22] Filed: Sep. 1, 1993

[51] Int. Cl.⁶ .......................................... H03K 19/177
[52] U.S. Cl. ...................................... 326/41; 326/39; 326/21; 326/93
[58] Field of Search ..................... 307/443, 465, 465.1, 307/480, 591, 594

[56] References Cited

U.S. PATENT DOCUMENTS

| | | | |
|---|---|---|---|
| 4,642,487 | 2/1987 | Carter | 307/465 |
| 5,225,719 | 6/1993 | Agrawal et al. | 307/465 |
| 5,323,069 | 6/1994 | Smith, Jr. | 307/465.1 |

Primary Examiner—David R. Hudspeth
Attorney, Agent, or Firm—Skjerven, Morrill, MacPherson, Franklin & Friel

[57] ABSTRACT

A programmable logic device has multiple groups of generic logic blocks. Each group of generic logic blocks is interconnected by a local routing pools. A global routing pool is provided to interconnect the local routing pools. The global and local routing pools can be implemented in volatile or non-volatile technology, such as E$^2$PROM technology. The programmable logic device can also be implemented as an in-system programmable logic device.

12 Claims, 11 Drawing Sheets

STRUCTURE AND METHOD FOR IMPLEMENTING HIERARCHICAL ROUTING POOLS IN A PROGRAMMABLE LOGIC CIRCUIT

BACKGROUND OF THE INVENTION

1. Field of the Invention

The present invention relates to programmable logic circuits, and in particular, relates to the design of efficient routing resources in a programmable logic circuit.

2. Discussion of the Related Art

Two examples of high density programmable logic devices ("PLDs") are the programmable Large Scale Integration (pLSI) devices and the in-system programmable Large Scale Integration (ispLSI) devices from Lattice Semiconductor Corporation, Hillsboro, Oreg. An ispLSI device is reprogrammable in its application without being removed from the circuit board. Programmable logic devices can also be implemented in both volatile and non-volatile memory technologies (e.g. electrical eraseable programmable read-only memory or E$^2$PROM). The high density programmable logic devicess, such as the pLSI and the ispLSI devices, are often referred to as "complex PLDs", as distinguished from a class of devices loosely referred to as "field programmable gate arrays" (FPGAs). In a complex PLD, programmable logic functions are configured by programming a number of programmable logic blocks, each programmble logic block is typically implemented by a gate array and has a number of input and output signals. In contrast, in an FPGA, the programmable logic functions are performed by a relatively large number of programmable logic units, each programmable logic unit receiving a relatively small number of logic signals and being implemented by a "look-up table" of logic functions, which is implemented by a relatively small number of logic gates or multiplexors.

One advantage of implementing a logic circuit in a complex PLD, rather than in an FPGA, is the predictable interconnect delay. In a complex PLD, interconnection between any two programmable logic blocks is provided by a global routing resource having predictable delay characteristics. Thus, the delay between any two portions of a circuit implemented in a complex PLD is predictable and substantially independent of which programmable logic block or blocks the two portions of the circuit are assigned.

In an FPGA, however, because of the large number of programmable logic blocks provided, more than one type of interconnection paths are typically provided. Each type of interconnection path in an FPGA has a different delay characteristic. For example, in one FPGA, interconnect resources of at least three levels of performance are provided: a) "direct lines" which is a connection between two neighboring programmable logic blocks, b) "local lines", which are interconnection paths servicing a small number of programmable logic blocks within a small locality in the FPGA, and c) "long lines" which reaches a greater distance than the local lines. The long lines are relatively scarce resource. Thus, because each programmable logic block in an FPGA implements only a relatively small logic function, a large number of programmable logic blocks are typically involved in implementing a circuit. Consequently, many interconnections between programmable logic blocks are required to provide the connectivity of the circuit. Futhrer, the connection path between any two portions of the circuit is often established by a combination of direct, local and long line connections. Since the partitioning of a circuit is seldom known prior to implementation, the interconnect delay for a circuit implemented in an FPGA is difficult to predict.

Figure 1:
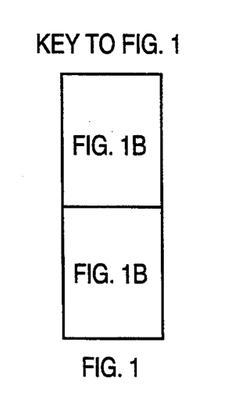
FIG. 1 shows a pLSI device 100 in the prior art using a single routing pool.
Figure 1A:
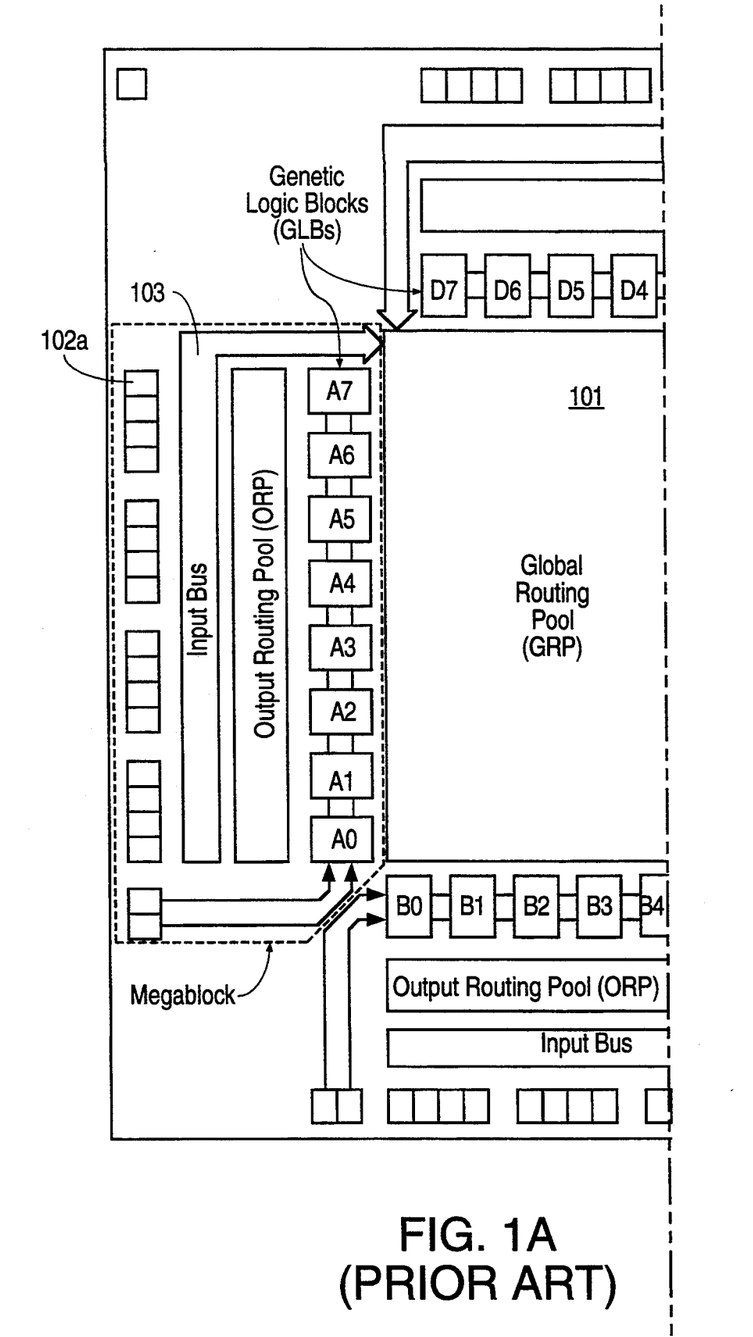
Figure 1B:
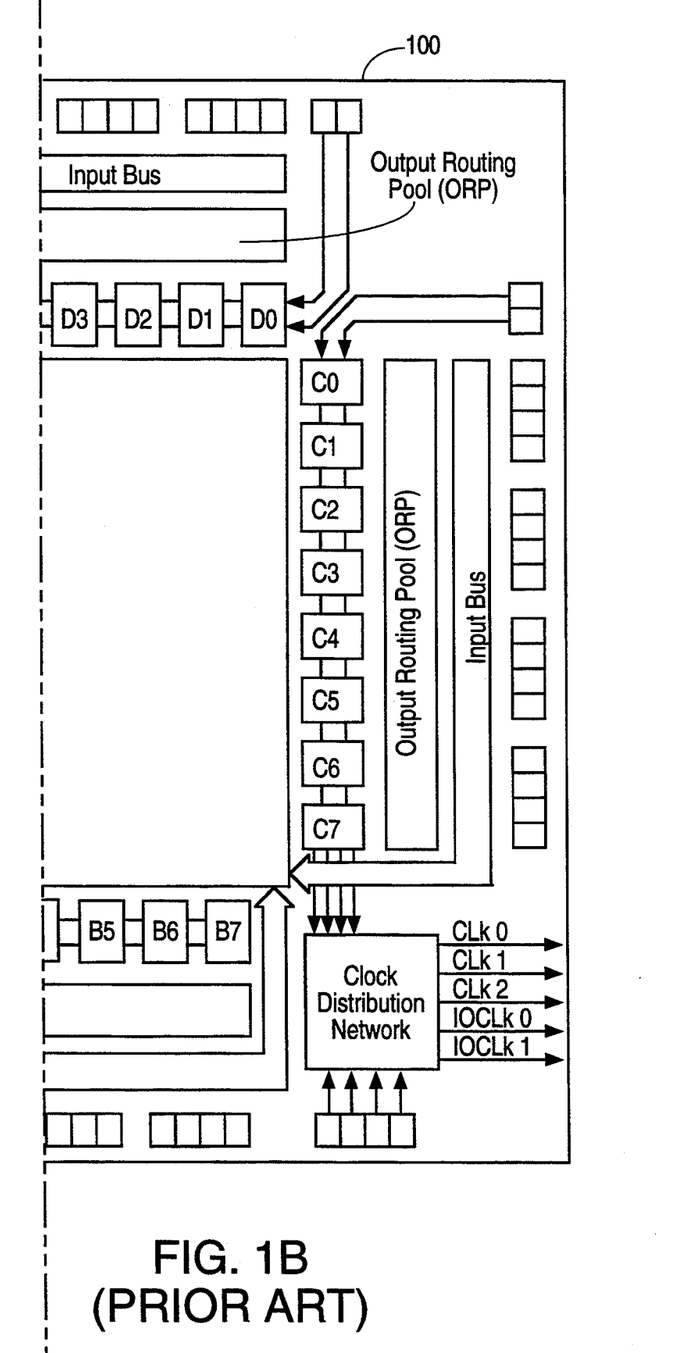

FIG. 1 shows a block diagram of a prior art complex PLD device 100, which can be implemented as either a pLSI device or an ispLSI device. As shown in FIG. 1, device 100 comprises 24 generic logic blocks (GLBs) A0-A7, B0-B7, C0-C7 and D0-D7. Each GLB includes a number of input terminals, a logic array for implementing logic functions and a number of output terminals. The signals at the GLB's input terminals originate either from the routing pool 101, or directly from input/output (I/O) pins, which are shown in FIG. 1 around the periphery of the device, e.g. I/O pin 102a. The signals of the output terminals of a GLB can be routed to both output routing pool 103 and routing pool 101. Output routing pool 103 routes signals between a group of GLBs and a group of I/O pins. Each I/O pin of pLSI device 100 is associated with an I/O cell, which is programmable to define whether the I/O pin is an input pin, an output pin or a bidirectional pin.

Routing pool 101 is a global interconnection resource for interconnecting the GLBs. Routing pool 101 receives input signals from both the I/O pins and the output terminals of the GLBs and provides the signals received to the input terminals of the GLBs. Routing pool 101 provides connectivity between any pair of GLBs in pLSI device 100. Because of its regular structure, routing pool 101 provides predictable and consistent delay between any pair of GLBs. However, because complete connectivity among GLBs is provided by routing pool 101, the size of routing pool 101 grows rapidly as the number of input signals to routing pool 101 increases. Hence, as the density of the pLSI device grows, the amount of silicon area dedicated for routing pool 101 increases undesirably. Further, as the size of routing pool 101 grows, the signal delay in transmission through routing pool 101 increases, while the AC switching current also increases. Neither the increase in signal delay, nor the increase in the AC switching current, is desirable.

SUMMARY OF THE INVENTION

In accordance with the present invention, a method and a programmable interconnection system for interconnecting programmable logic blocks are provided. Such a system contains a number of local programmable interconnection circuits for interconnecting separate and distinct groups of programmable logic blocks, and a global programmable interconnection circuit for interconnecting among the number of local programmable interconnection circuits.

The system of the present invention is not limited to one level of local interconnection circuits interconnected by a global interconnection circuit. Multiple levels of local interconnection circuits are possible.

The interconnection circuits of the present invention can be implemented by either a volatile memory technology, or a non-volatile memory technology. Further, in-system programmable techniques can be used to allow flexible reprogramming without physical removal of the programmable logic circuit.

Using the multi-level interconnection system of the present invention, and routing over the global routing pool only a fraction of total number of signals received by each local routing pool, significant reduction of silicon area is achieved. The interconnection system can be optimally used by preferentially implementing interconnected logic circuits in the logic blocks served by the same local routing pool, thereby reducing the number of signals required to cross over the global routing pool. In this manner, signals between the programmable logic blocks are, in most cases, transmitted over a local routing pool, which is a smaller interconnection circuit than what would be under a single routing pool system. Thus, despite the increase in the density of the programmable logic device, signal delays in transmission through the interconnection circuit are kept generally low. Because of the reduced load in the local routing pool, which serves a smaller number of programmable logic blocks, the AC switching currents are generally also kept low.

The present invention is better understood upon consideration of the detailed description below, and the accompanying drawings.

BRIEF DESCRIPTION OF THE DRAWINGS

FIG. 2b shows a typical GLB 250 of the programmable logic device 200 of FIG. 2a.

DETAILED DESCRIPTION OF THE PREFERRED EMBODIMENT

Figure 2A:
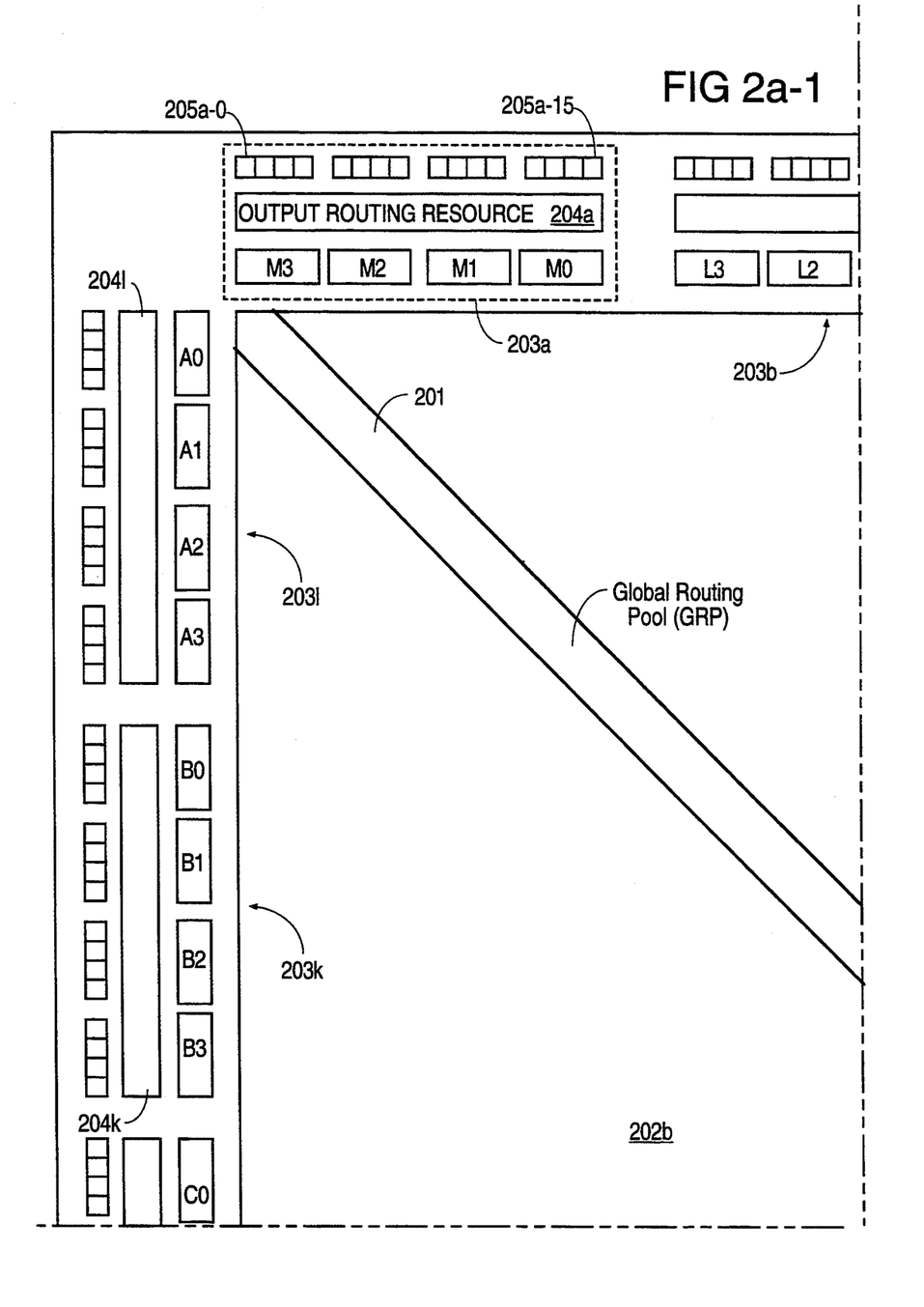
Figure 2A:
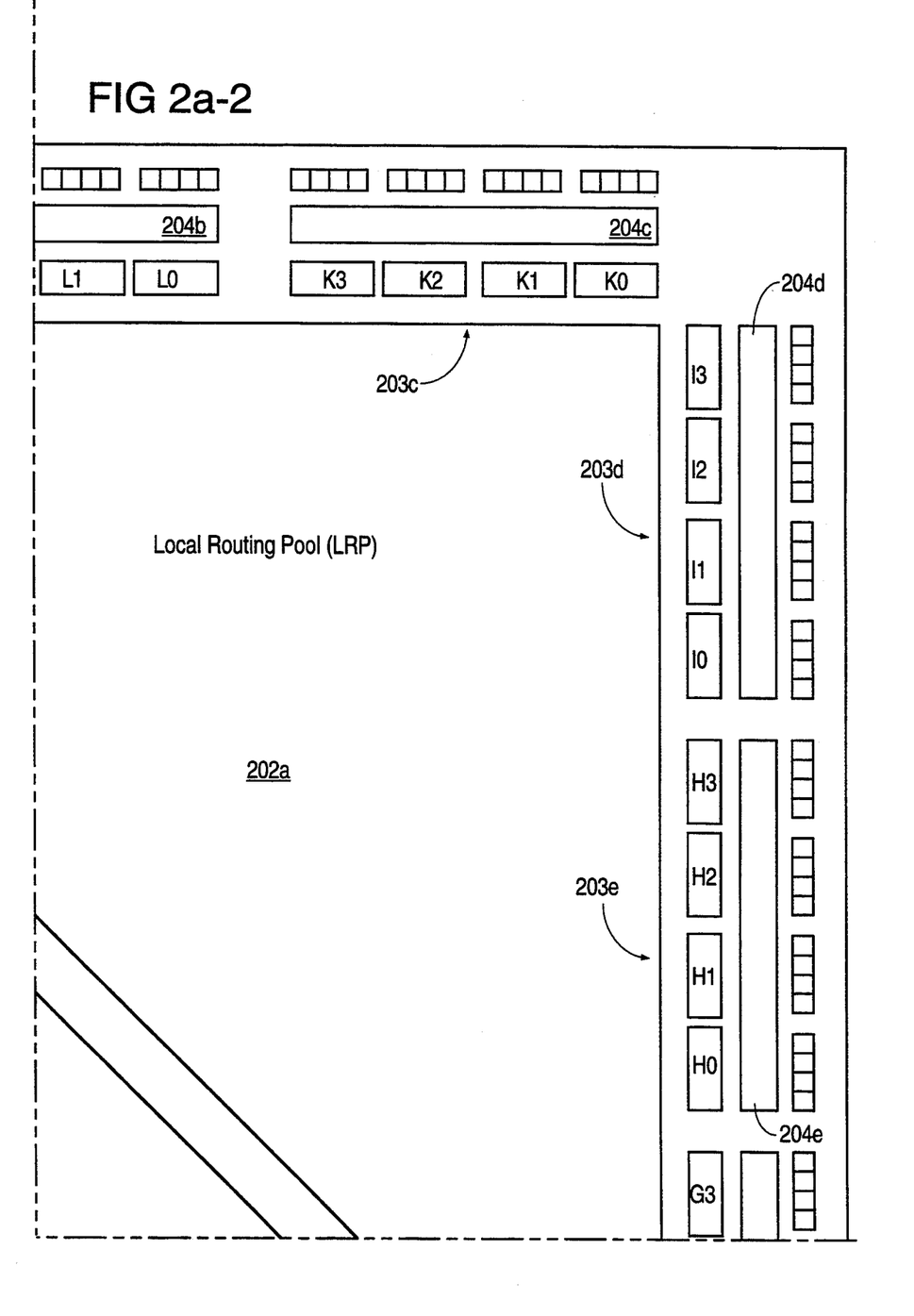
Figure 2A:
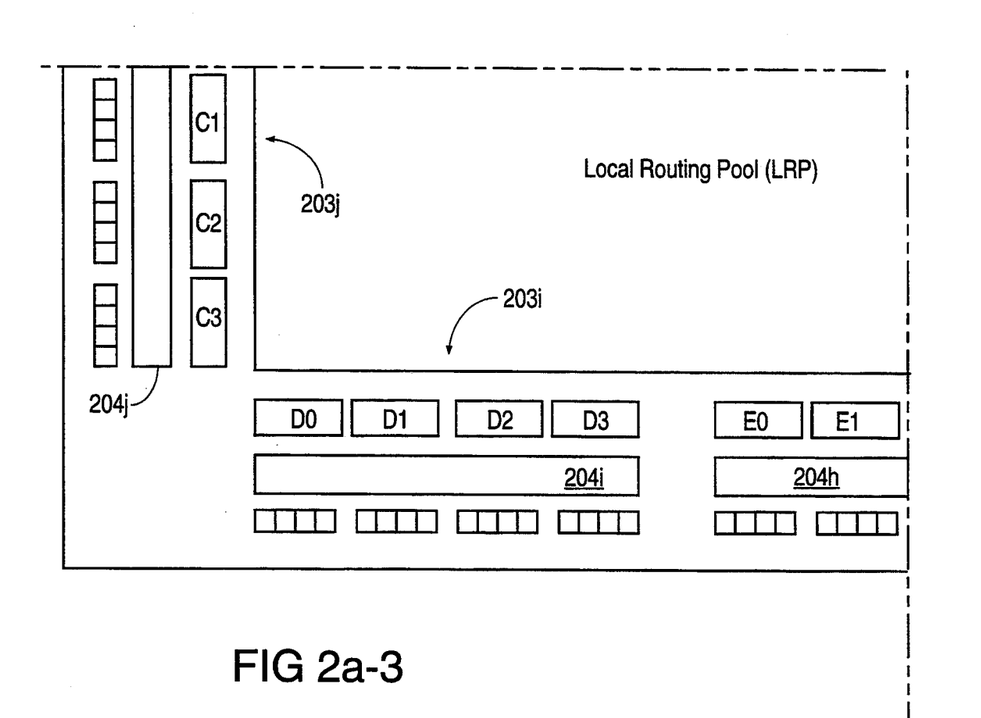
Figure 2A:
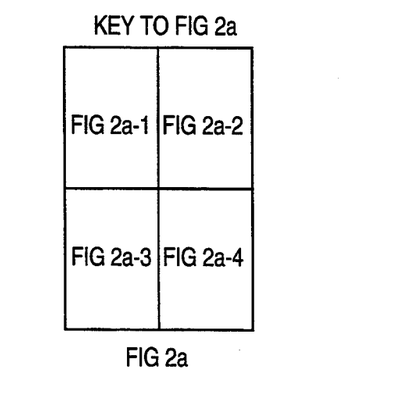
FIG. 2a shows a programmable logic device 200 having a global routing pool 201 for providing connectivity between two local routing pools 202a and 202b, in accordance with the present invention.
Figure 2A:
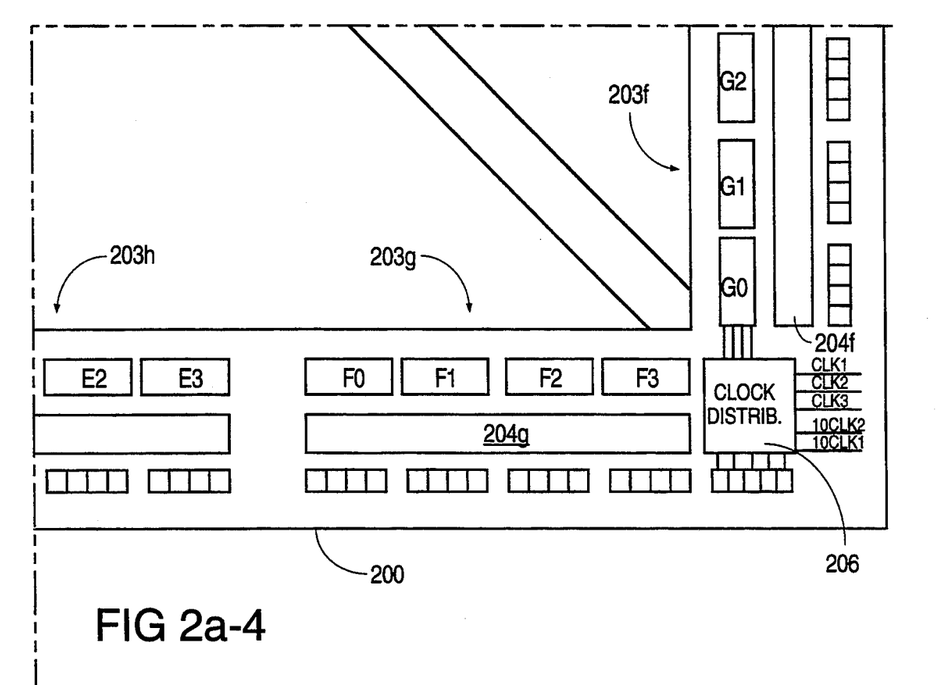
Figure 2B:
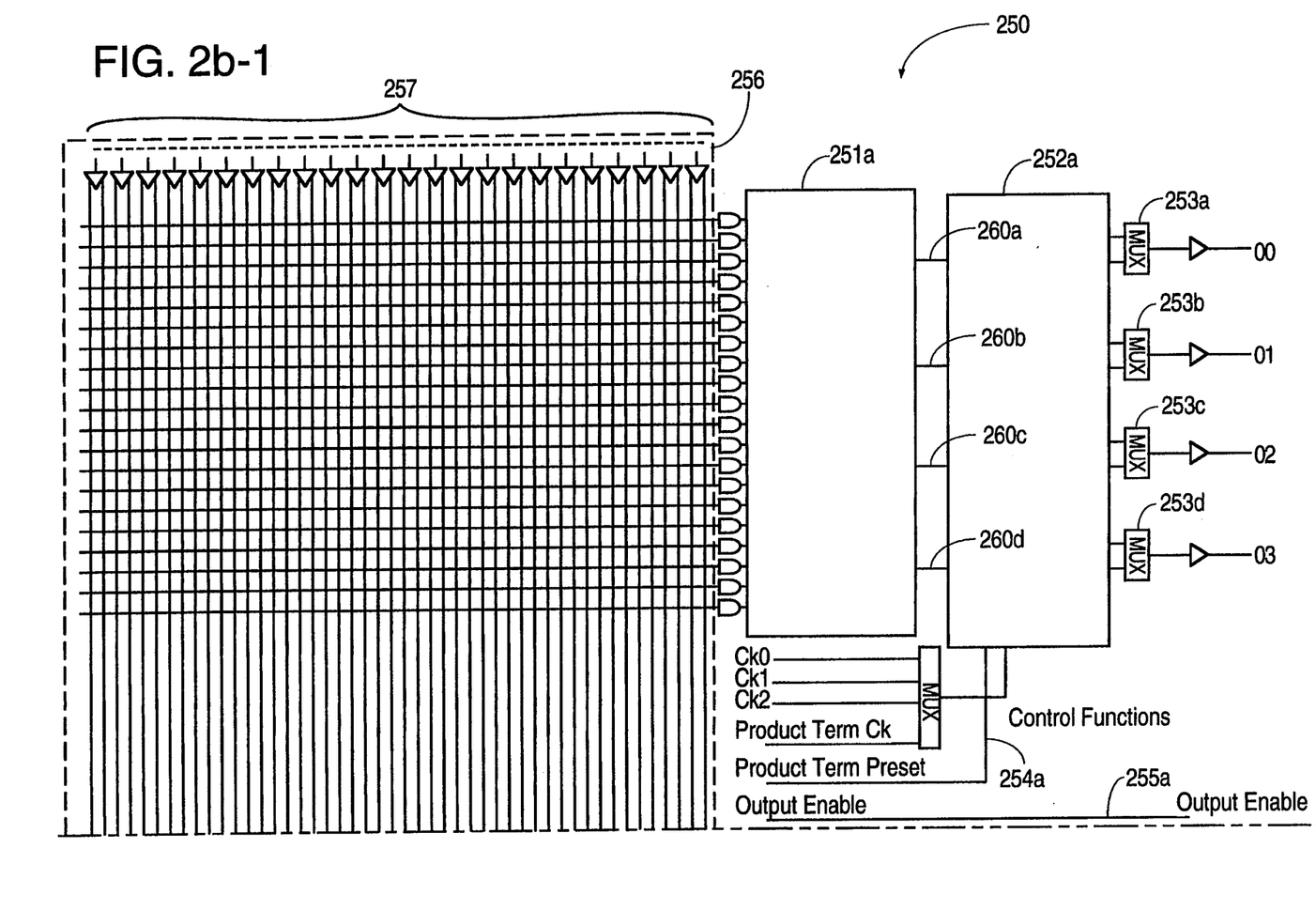

FIG. 2a shows, in one embodiment of the present invention, a programmable logic device 200 including 12 "megablocks" 203a-2031. Each megablock includes four generic logic blocks ("GLBs", e.g. GLB M0-M3 in megablock 203a), an output routing pool (e.g. output routing pool 204a), and 16 I/O cells (e.g. I/O cell 205a-1 or 205a-16). In addition, programmable logic device 200 includes a clock distribution structure 206, two local routing pools ("LRP") 202a and 202b, and a global routing pool ("GRP") 201. LRPs 202b and 202a provide connectivity among GLBs A0–F3, and GLBs G0–M3 respectively. GRP 201 provides connectivity between LRPs 202a and 202b.

Clock distribution network 206 can receive from outside programmable logic device 200 five clock signals on five dedicated clock pins. GLB G0 can also be configured to generate additional clock signal inputs to clock distribution network 206. Five clock signals (three for logic blocks, e.g. GLBs, and two for I/O cells) can be distributed from clock distribution network 206 to any GLBs or I/O cell of programmable logic device 200.

Figures 2B, 2B:
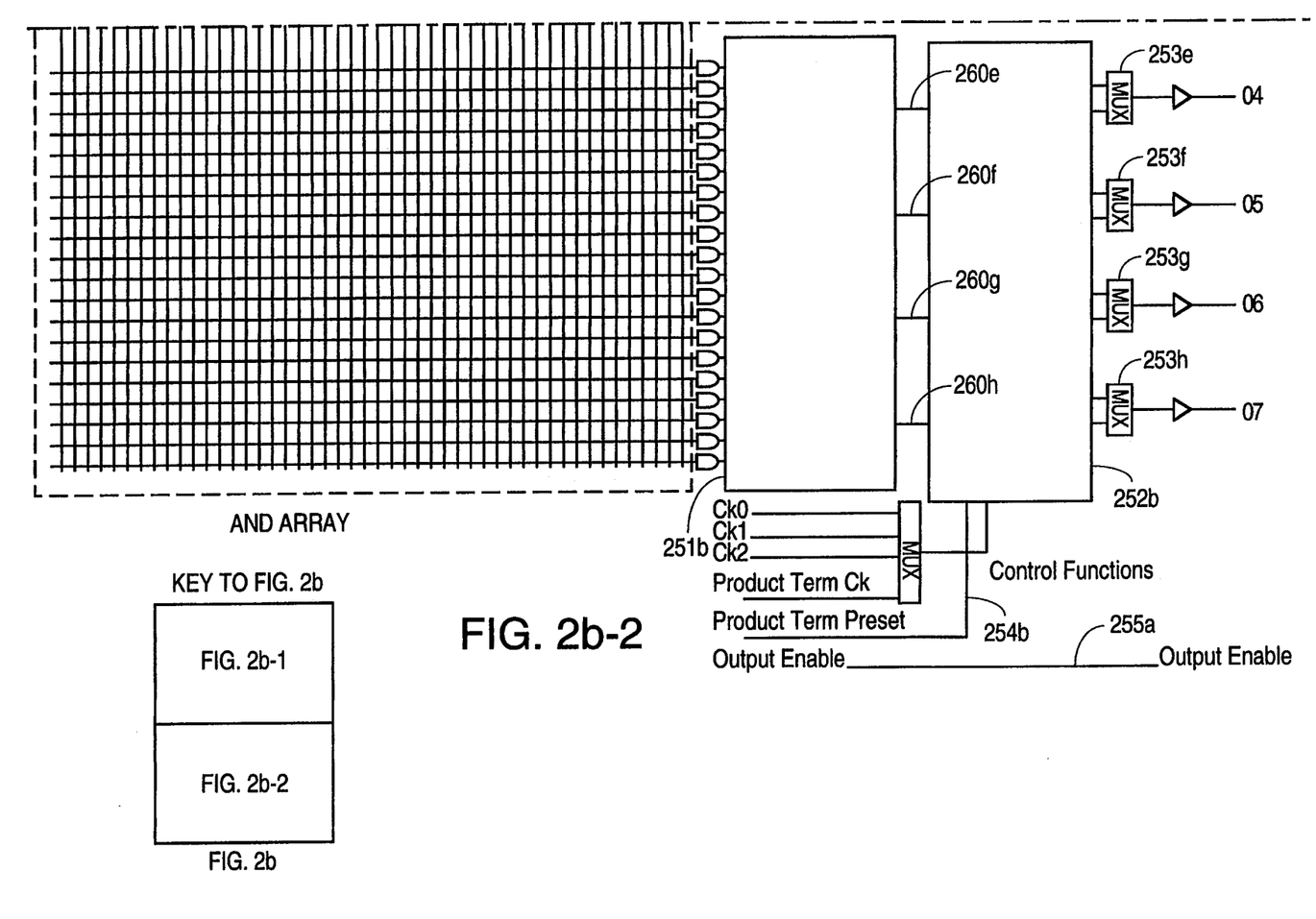

FIG. 2b shows a typical structure 250 of a GLB in programmable logic device 200. As shown in FIG. 2b, each GLB has 24 input terminals (collectively referred to as input terminals 257), eight output terminals 01–07, and an AND array 256. Input terminals 257 carry signals to AND array 256 from the LRP (say, LRP 202a) which serves GLB 250. AND array 256 receives (a) output signals of GLBs served by LRP 202a, (b) output signals from I/O cells in the megablocks which includes GLBs served by LRP 202a, and (c) output signals received over GRP 201. The signals received over GRP 201 include output signals of GLBs served by LRP 202b, and output signals from I/O cells in the megablocks which includes the GLBs served by LRP 202b. AND array 256 also receives four internal "fast feedback" signals from the product-term sharing arrays ("PTSAs") 251a and 251b of GLB 250.

AND array 256 generates 2 groups of twenty product-term signals. Each product-term signal, which is provided both in logic true and the complement forms, is a logic product involving any number of the input signals received into AND array 256. In FIG. 2b, a first group of twenty product term signals is received by PTSA 251a, and a second group of twenty product term signals is received by PTSA 251b. Product-term sharing arrays, such as product term sharing arrays 251a and 251b, are discussed in detail in U.S. Pat. No. 5,130,574, entitled "Programmable Logic Device Providing Product Term Sharing and Steering to the Outputs of the Programmable Logic Device," to J. Shen et al, filed on May 6, 1991, issued on Jul. 14, 1992, and assigned to Lattice Semiconductor Corporation. U.S. Pat. No. 5,130,574 is hereby incorporated by reference in its entirety.

Output stage 252a includes output logic macrocells providing various programmable logic functional capabilities for generating either a registered or a combinatorial output signals of PTSA 251a. This type of logic macrocells used in output stage 252a are discussed in detail in U.S. Pat. No. 5,191,243, entitled "Output Logic Macrocell with Enhanced Functional Capabilities," to J. Shen et al, filed on May 6, 1991 and issued on Mar. 2, 1993. U.S. Pat. No. 5,191,243 is hereby incorporated by reference in its entirety.

The output signals of multiplexer 253a–253d are provided as output signals 00–03. Output signals 00–03 are routed back to LRP 202a or, via the output routing pool of GLB 250's megacell, to the associated I/O cells.

Figure 2C:
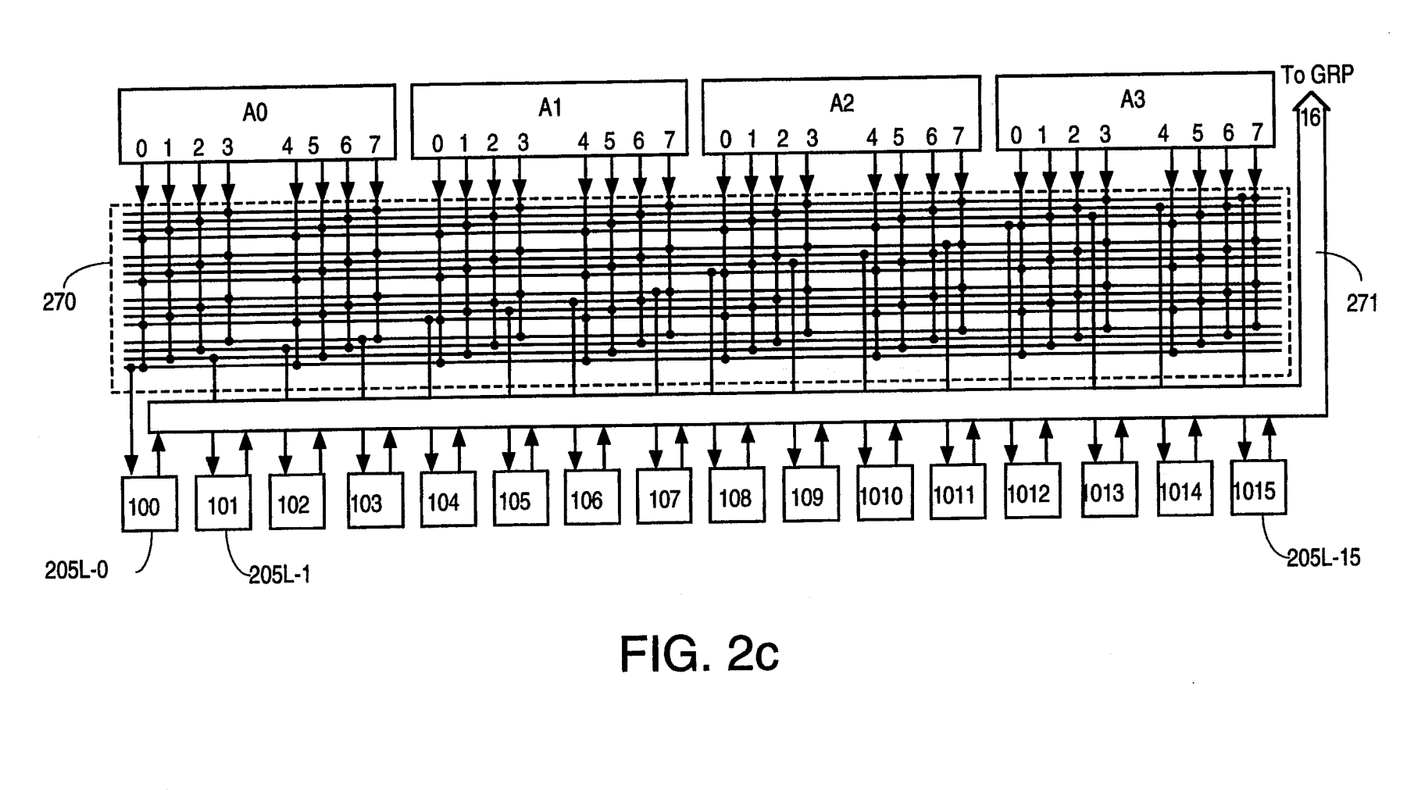
FIG. 2c shows output routing pool 2041 in programmable logic device 200 of FIG. 2b.

FIG. 2c shows output routing pool 2041, which serves GLB 2041 of programmable logic device 200 (FIG. 2a). As shown in FIG. 2c, GLBs A0–A3 are connected to a switch matrix 270. Switch matrix 270 receives from GLB A0–A3 their 32 output signals, and provides 16 output signals to I/O pins 2051-0 to 2051-15. Each of the 32 output signals of GLB A0–A3 is routed to four I/O cells. I/O cells 2031-0 to 2031-15 can each be configured as an input pin, an output pin, or a bidirectional pin. When configured as an input pin, the input signal received is routed via bus 271 to LRP 202b.

Figure 2D:
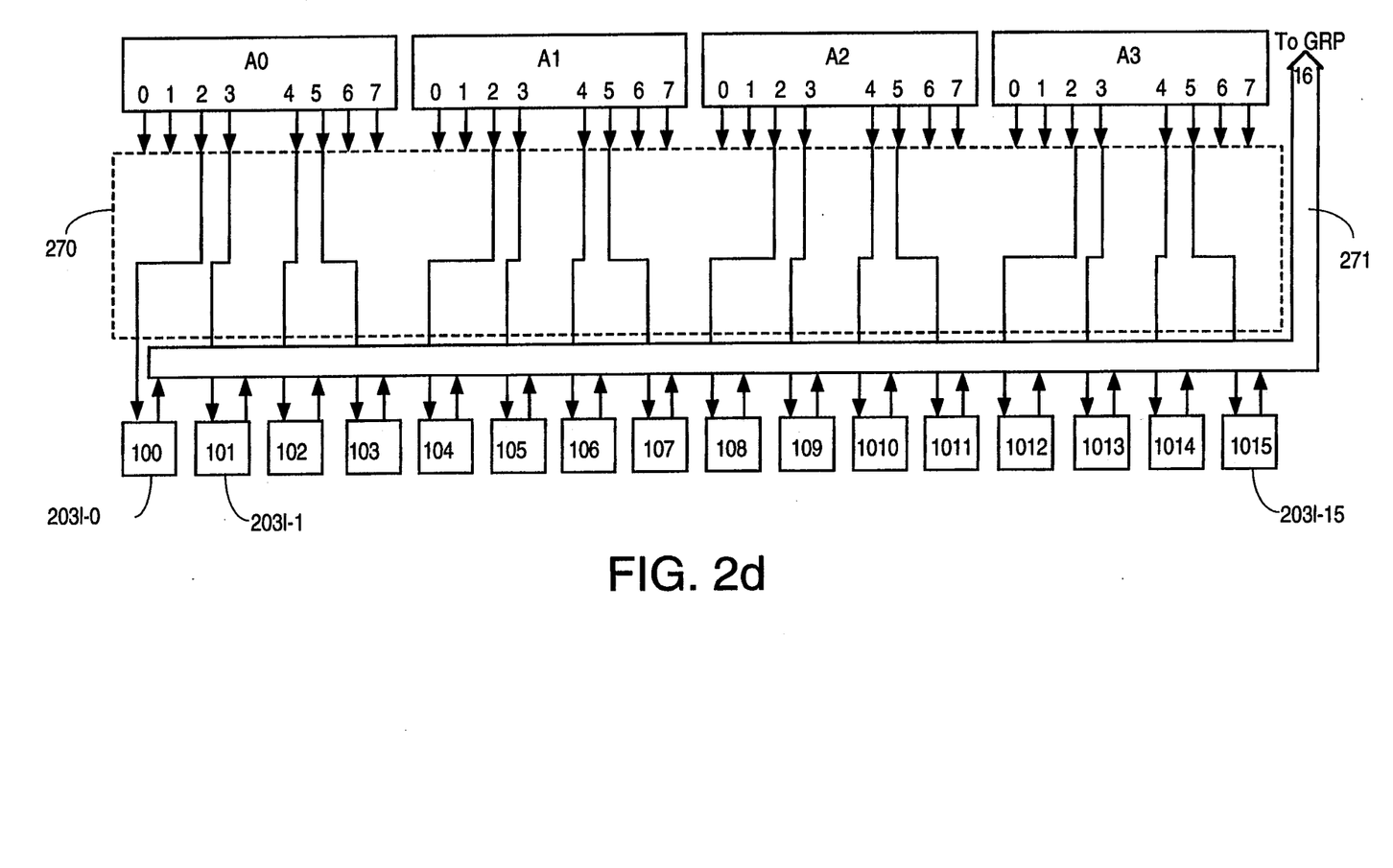
FIG. 2d shows output routing pool 2041 of programmable logic device 200 of FIG. 2b, showing a bypass mechanism.

To provide higher speed connections, four of the eight output terminals of each GLB are provided programmable bypass signal paths to four I/O cells. These bypass connections are shown in FIG. 2d.

Figure 3:
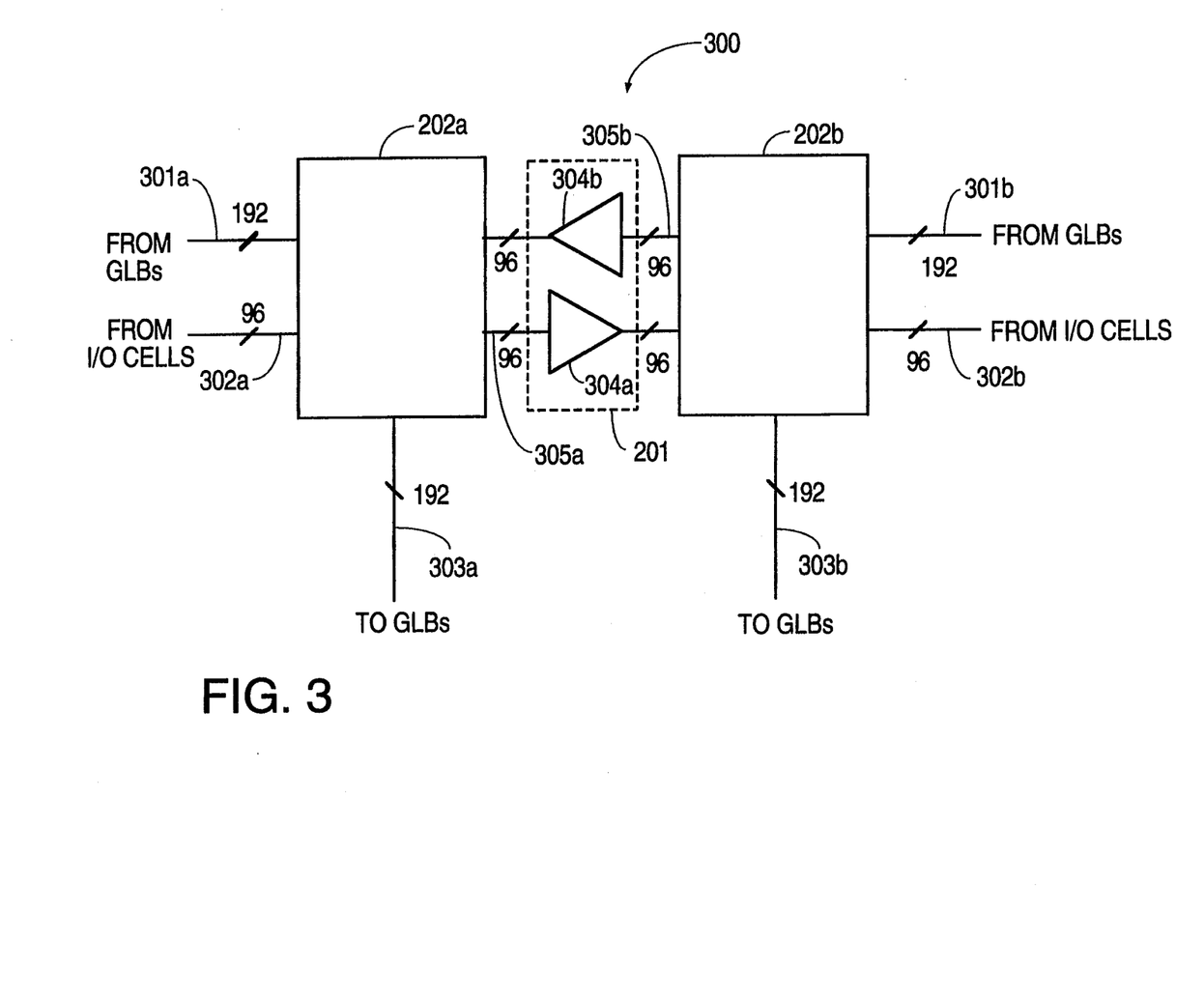
FIG. 3 shows the interconnect resources LRPs 202a and 202b, and GRP 201, in accordance with the present invention.

LPR 202a and LPR 202b are interconnection resources serving GLBs G0–M3, and A0–F3, as shown in FIG. 2a. FIG. 3 is a block diagram of a structure 300 implementing LRP 202a, LRP 202b, and GRP 201. As shown in FIG. 3, each LRP has (i) 96 input terminals, collectively indicated by reference numeral 302a or 302b, receiving input signals from the I/O cells associated with the GLBs served by the LRP, (ii) 192 input terminals, collectively indicated by reference numeral 301a or 301b, receiving input signals from the eight output signals from the GLBs served by the LRP, (iii) 96 input terminals, collectively indicated by reference numeral 303a or 303b, for receiving from GRP 201 signals which originate from the other LRP, and (iv) 192 output terminals, collectively indicated by reference numeral 305a or 305b, for routing each of the 288 input signals received by the LRP to 96 of the input terminals of the GLBs served by the LRP. LRP 202a and 202b are each implemented according to the interconnect structure discussed in U.S. Pat. No. 5,204,556, entitled "Programmable Interconnect Structure for Logic Blocks," by Kapil Shankar, filed on May 6, 1991, issued on Apr. 26, 1993 and assigned to Lattice Corporation, which is the Assignee of the present application. U.S. Pat. No. 5,204,556 is hereby incorporated by reference in its entirety. LRP 202a provides 96 output terminals to route signals through GRP 201 to LRP 202b. Likewise, LRP 202b provides 96 output terminals to route signals through GRP 201 to LRP 202a.

GRP 201 interconnects LRP 202a and 202b. To improve performance, the interconnections 305a and 305b are provided buffers, which are collectively indicated by reference numerals 304a and 304b respectively. Using GRP 201 to interconnect LRP 202a and 202b maintains connectivity between GLBs A0–F3 (served by LRP 202b) and GLBs G0–M3 (served by LPR 202b), while routing only a fraction of total number of signals received by LRPs 202a and 202b. Consequently, significant reduction of silicon area is achieved. Structure 300 can be optimally used by preferentially implementing interconnected logic circuits in GLBs served by the same LRP, thereby reducing the number of signals required to cross over via GRP 201. Under such condition, signals between GLBs are, in most cases, transmitted over an LRP, which is a smaller interconnection circuit than the alternative under a single routing pool system. Thus, despite the increase in the number of GLBs in the programmable logic device, the signal delays in transmission through the interconnection circuit are kept generally low. Because of the reduced load in the LRP, which serves a smaller number of GLBs, the AC switching currents are generally also kept low. LRP 202a and LRP 202b, and GRP 201 are each regular in structure, so that signal delays either within each LRP or over GRP 201 remain predictable and consistent.

The above detailed description is illustrative of the specific embodiments of the present invention and is not intended to be limiting. Many modifications and variations within the scope of the present invention are possible. For example, the number of LRPs served by a GRP is not limited to two. Further, the present invention is not limited to two levels of interconnections, i.e. a hierarchy of interconnection circuits can be implemented. As another example, the interconnections in GRP 201 and LRP 202a and 202b can be implemented in either volatile or non-volatile memory technology. Using in-system programming techniques, the interconnections can be reprogrammed in-system without removal of the integrated circuit from its circuit board. In-system programming techniques are discussed in U.S. Pat. No. 4,855,954 (entitled "In-system Programmable Logic Device with Four Dedicated Terminals" to Turner et al, issued Aug. 8, 1989), U.S. Pat. No. 4,761,768 (entitled "Programmable Logic Device", to Turner et al, issued Aug. 2, 1988), and U.S. Pat. No. 4,896,296 (entitled "Programmable Logic Device Configurable I/O Cell", to Turner et al, issued Jan. 23, 1990). The in-system programming techniques discussed in these U.S. Patents are hereby incorporated by reference.

The present invention is defined by the following claims.

We claim:

1. In a complex PLD, a programmable interconnection system for interconnecting programmable logic blocks comprising:
    a first programmable interconnection circuit for interconnecting a first group of programmable logic blocks, said first programmable interconnection circuit providing substantially the same delay between any two programmable logic blocks within said first group;
    a second programmable interconnection circuit for interconnecting a second group of programmable logic blocks, said second group of programmable logic blocks being separate and distinct from said first group of programmable logic blocks, said second programmable interconnection circuit providing substantially the same delay between any two programmable logic blocks within said second group; and
    a third programmable interconnection circuit for interconnecting said first and second programmable interconnection circuits.

2. A programmable interconnection system as in claim 1, wherein said first, second and third interconnection circuits are implemented in a volatile memory technology.

3. A programmable interconnection system as in claim 1, wherein said first, second and third interconnection circuits are implemented in a non-volatile memory technology.

4. A programmable interconnection system as in claim 1, wherein said programmable interconenction system is reprogrammable using in-system programmable techniques.

5. A programmable interconnection system as in claim 1, wherein said programmable interconnection system being implemented in a programmable logic device having a plurality of input pins, said programmable logic blocks each having a plurality of input terminals and a plurlaity of output terminals, said first and second interconnection circuits each comprising:
    a first set of input terminals receiving signals from said output terminals of said programmable logic blocks;
    a second set of input terminals receiving signals from said input pins; and
    a plurality of output terminals for providing said signals from said first and second sets of input terminals to said input terminals of said programmable logic blocks.

6. A programmable interconnection system as in claim 1, further comprising:
    fourth, fifth and sixth interconnection circuits substantially identically to said first, second and third interconnection circuits respectively, said fourth and fifth circuits interconnecting respectively third and a fourth groups of programmable logic blocks, and said sixth interconnection circuit interconnecting said fourth and fifth interconnection circuits; and
    a seventh interconnection circuit interconnecting said third and sixth interconnection circuit.

7. A method in a programmable interconnection system for interconnecting programmable logic blocks comprising:

interconnecting a first group of programmable logic blocks using a first programmable interconnection circuit, said first programmable interconnection circuit providing substantially the same delay between any two programmable logic blocks within said first group;

interconnecting a second group of programmable logic blocks using a second programmable interconnection circuit, said second group of programmable logic blocks being separate and distinct from said first group of programmable logic blocks, said second programmable interconnection circuit providing substantially the same delay between any two programmable logic blocks within said second group; and interconnecting said first and second programmable interconnection circuits using a third programmable interconnection circuit.

8. A method as in claim 7, wherein said first, second and third interconnection circuits are implemented in a volatile memory technology.

9. A method as in claim 7, wherein said first, second and third interconnection circuits are implemented in a non-volatile memory technology.

10. A method as in claim 7, wherein said programmable interconnection system is reprogrammable using in-system programmable techniques.

11. A method as in claim 7, wherein said programmable interconnection system being implemented in a programmable logic device having a plurality of input pins, said programmable logic blocks each having a plurality of input terminals and a plurlaity of output terminals, said step of interconnecting said first group of programmable logic blocks and said step of interconnecting said second group of programmable logic blocks each comprising the steps of:

receiving signals from said output terminals of said programmable logic blocks at a first set of input terminals;

receiving signals from said input pins at a second set of input terminals; and providing said signals from said first and second sets of input terminals to said input terminals of said programmable logic blocks at a plurality of output terminals.

12. A method as in claim 7, further comprising:

interconnecting third and a fourth groups of programmable logic blocks using fourth and fifth interconnection circuits in the same manner as provided for said first and second groups of programmable logic blocks, said fourth and fifth interconnection circuits being substantially identical to said first and second interconnection circuits;

interconnecting said fourth and fifth interconnection circuits using a sixth interconnection circuit; and interconnecting said third and sixth interconnection circuits using a seventh interconnection circuit.

* * * * *